(12) United States Patent
Conan et al.

(10) Patent No.: US 9,841,773 B2
(45) Date of Patent: Dec. 12, 2017

(54) COOLING SYSTEM MANAGEMENT

(71) Applicant: GLOBALFOUNDRIES Inc., Grand Cayman (KY)

(72) Inventors: Valentin Conan, Vergeze (FR); Kevin Larue, Tours (FR); Bernard Ludmann, Montferrier sur Lez (FR); Thierry Mottaz, Teyran (FR)

(73) Assignee: GLOBALFOUNDRIES INC., Grand Cayman (KY)

( * ) Notice: Subject to any disclaimer, the term of this patent is extended or adjusted under 35 U.S.C. 154(b) by 843 days.

(21) Appl. No.: 14/219,460

(22) Filed: Mar. 19, 2014

(65) Prior Publication Data

US 2014/0316605 A1 Oct. 23, 2014

(30) Foreign Application Priority Data

Apr. 18, 2013 (EP) ..................................... 13305509

(51) Int. Cl.
*G05D 23/30* (2006.01)
*G05D 23/19* (2006.01)
(Continued)

(52) U.S. Cl.
CPC ......... *G05D 23/1917* (2013.01); *G05D 23/30* (2013.01); *H05K 7/20836* (2013.01); *F28F 27/00* (2013.01)

(58) Field of Classification Search
CPC ............... G05D 23/1917; G05D 23/30; H05K 7/20836; F28F 27/00
See application file for complete search history.

(56) References Cited

U.S. PATENT DOCUMENTS

| | | | |
|---|---|---|---|
| 8,369,090 B2 * | 2/2013 | Chester | H05K 7/20772 165/104.33 |
| 8,630,830 B1 * | 1/2014 | DiStefano, III | G06F 17/5009 703/6 |

(Continued)

OTHER PUBLICATIONS

J. Ma et al. , Demand reductioninbuildingenergysystemsbasedoneconomicmodel predictive control, Aug. 18, 2011.*

(Continued)

*Primary Examiner* — Ryan Jarrett
(74) *Attorney, Agent, or Firm* — Anthony Canale; Andrew M. Calderon; Roberts Mlotkowski Safran Cole & Calderon, P.C.

(57) ABSTRACT

A cooling system controller, method, and computer program (or product) for an installation of heat generating machines having variable cooling requirements, the cooling system comprising two or more thermal components sharing a first cooling fluid circuit and first cooling fluid for cooling the installation, the cooling system controller comprising: a requirement discovery engine for recording the variable cooling requirements of the machines; a characterizing engine for measuring and recording outputs for each thermal component in response to a plurality of input control settings for generating a respective set of static set-points for each thermal component; a logic model generator for generating a logical model of the thermal components based on: relationships between the thermal components, operating fluid flow and around the thermal components, static set-points of each component; an optimizer for finding minimum energy consumption for the cooling system; and an interface for continuously adjusting control settings for each component to keep the cooling system operating at the minimum energy consumption.

16 Claims, 8 Drawing Sheets

(51) Int. Cl.
*H05K 7/20* (2006.01)
*F28F 27/00* (2006.01)

(56) References Cited

U.S. PATENT DOCUMENTS

| | | | | |
|---|---|---|---|---|
| 8,631,411 B1* | 1/2014 | Ghose | ............... | G06F 1/206 |
| | | | | 361/676 |
| 2003/0193777 A1* | 10/2003 | Friedrich | ............ | G06F 1/206 |
| | | | | 361/679.53 |
| 2009/0089009 A1* | 4/2009 | Miller | ............ | G05B 23/024 |
| | | | | 702/179 |
| 2010/0131109 A1* | 5/2010 | Rasmussen | ......... | G06F 1/206 |
| | | | | 700/277 |
| 2010/0243231 A1* | 9/2010 | Rosen | ............ | G05D 23/1904 |
| | | | | 165/237 |
| 2012/0016526 A1* | 1/2012 | Burton | ............ | F24F 11/008 |
| | | | | 700/278 |

OTHER PUBLICATIONS

Office Action in related U.S. Appl. No. 14/512,404 dated Jan. 31, 2017, 17 pages.

\* cited by examiner

COOLING SYSTEM MANAGEMENT

BACKGROUND

This invention relates to a method and apparatus for cooling system management. In particular, this relates to a method and apparatus for cooling system management based on in situ characterization of components participating in a cooling system. At macro level, the cooling system is considered as an assembly of passive (for example, pipe distribution) and interconnected active elements (for example, computer room air conditioning units, or "CRACs") to build a coherent looped function.

Within a computer center containing many computers, power needs to dissipate to avoid damaging the computers. Average computer center power has tended to increase in line with increases in processor performance within the computers. This tendency poses a challenge at the computer and computer center level as better performance is needed to cool and to limit the temperature of the air of the computer center.

In many large server applications, processors along with their associated electronics (for example: memory, disk drives, power supplies) are packaged in removable drawer configurations stacked within a rack or frame. In other cases, the electronics may be in fixed locations within the rack or frame. Typically, the components are cooled by fluid cooling circuits. In some cases, it may be possible to handle increased power dissipation within a single drawer by providing greater fluid flow, through the use of more powerful fluid pumping devices or by increasing the rotational speed (that is, revolutions per minute) of existing fluid pumps. However, this approach becomes problematic with increasing complexity of the installation.

Addressing thermal imbalances within a data centre is often an expensive and time consuming operation. Therefore, there is a need in the art for methods which facilitate thermal and energy based design, analysis and optimization of electronics equipment of a data center.

BRIEF SUMMARY OF THE INVENTION

In a first aspect of the invention, there is provided a cooling system controller for an electronic installation of heat generating machines having variable cooling requirements, the cooling system comprising: two or more thermal components sharing a first cooling fluid circuit and first cooling fluid for cooling the installation, the cooling system controller comprising: a requirement discovery engine for recording the variable cooling requirements of the machines; a characterizing engine for measuring and recording outputs for each thermal component in response to one or more fluid inputs and a plurality of input control settings for generating a respective set of set-points for each thermal component; a logic model generator for generating a logical model of the thermal components based on: relationships between the thermal components, operating fluid flow and around the thermal components, static set-points of each component; an optimizer for finding minimum energy consumption for the cooling system; and an interface for continuously adjusting control settings for each component to keep the cooling system operating at the minimum energy consumption.

In a second aspect of the invention, there is provided a method for managing a cooling system for an installation of heat generating machines having variable cooling requirements, the cooling system comprising two or more thermal components sharing a first cooling fluid circuit and first cooling fluid for cooling the installation, the method comprising: recording the variable cooling requirements of the machines; measuring and recording outputs for each thermal component in response to a plurality of input control settings for generating a respective set of static set-points for each thermal component; measuring and recording changes in output over time for each thermal component in response to a plurality of input control setting changes; generating a logical model of the thermal components based on: relationships between the thermal components, operating fluid flow and around the thermal components, and set-points of each component; finding a minimum energy consumption for the cooling system; and continuously adjusting control settings for each component to match the minimum energy consumption.

In a third aspect of the invention, there is provided a method in a computer cooling installation system (with many cooling appliances) comprising: characterizing each cooling appliance in a static and a dynamic dimension indexed by their effective direct environment conditions; linking all cooling appliances as a logical network; extracting from a set of cooling parameters including inputs and outputs from the logical network and using parameters constraints to optimize the cooling parameter inputs for the lowest overall power consumption; and when the cooling parameters change, extracting a "transition route" from the optimized parameters to the new parameters.

In a fourth aspect of the invention, there is provided a computer program product for a computer controlled cooling installation, the computer program product comprising a computer-readable storage medium having computer-readable program code embodied therewith and the computer-readable program code configured to perform the methods.

In a fifth aspect of the invention, there is provided a computer program stored on a computer readable medium and loadable into the internal memory of a digital computer, comprising software code portions, when the program is run on a computer, for performing the method claims.

In a sixth aspect of the invention, there is provided a data carrier aspect of the preferred embodiment that comprises functional computer data structures to, when loaded into a computer system and operated upon thereby, enable the computer system to perform the method claims. A suitable data-carrier could be a solid-state memory, magnetic drive or optical disk. Channels for the transmission of data may likewise comprise storage media of all descriptions as well as signal-carrying media, such as wired or wireless signal-carrying media.

BRIEF DESCRIPTION OF THE SEVERAL VIEWS OF THE DRAWINGS

Preferred embodiments of the present invention will now be described, by way of example only, with reference to the following drawings in which.

DETAILED DESCRIPTION

Figure 1:
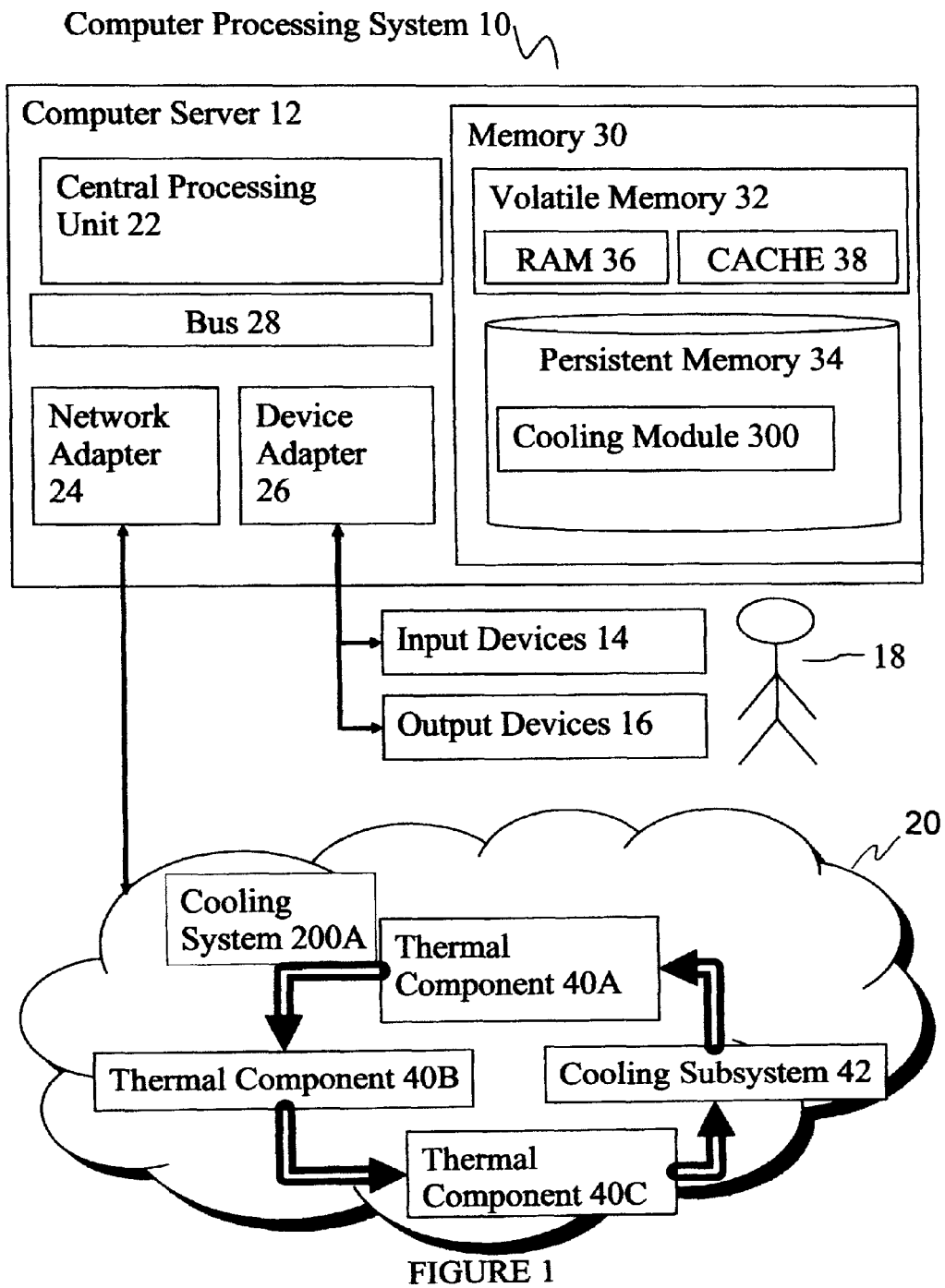
FIG. 1 is a deployment diagram of the preferred embodiment.

In a first aspect of the invention, there is provided a cooling system controller for an electronic installation of heat generating machines having variable cooling requirements, the cooling system comprising: two or more thermal components sharing a first cooling fluid circuit and first cooling fluid for cooling the installation, the cooling system controller comprising: a requirement discovery engine for recording the variable cooling requirements of the machines; a characterizing engine for measuring and recording outputs for each thermal component in response to one or more fluid inputs and a plurality of input control settings for generating a respective set of set-points for each thermal component; a logic model generator for generating a logical model of the thermal components based on: relationships between the thermal components, operating fluid flow and around the thermal components, static set-points of each component; an optimizer for finding minimum energy consumption for the cooling system; and an interface for continuously adjusting control settings for each component to keep the cooling system operating at the minimum energy consumption.

The cooling system is a looped system, where any heat level and/or distribution change affects the working conditions of one or some thermal components. Similarly, such working conditions are affected when external conditions (air hygrometry, temperature, wind flow) change. For a given environment condition exercised on the cooling chain, each thermal component (also known as a sub-unit) 'Sn' can be characterized as a thermal function 'fn':

$$Sn \text{ consumption} = fn(INn, OUTn, SPn) \qquad 1)$$

Sn consumption represents the electrical energy consumed by the thermal component.

INn represents thermodynamic characteristics of all input elements of the thermal function. By construction, some of these are part of the environmental conditions that the cooling system handles.

OUTn represents thermodynamic characteristics of all output elements of a thermal function. By construction, some of these thermal functions are impacting some of the environmental conditions that the cooling system handles.

SPn is the set of set-points for an active thermal component.

No SPn are necessary in the function when considering passive functions (for example, piped fluid distribution modules).

The purpose of the cooling system controller is to characterize, for changing environmental conditions, two or more thermal functions and test for these environmental conditions for different set-points of the thermal functions. The cooling system controller has a purpose, in order to extend the learning envelope prior to wait (or suddenly have to face) to new never encountered new external conditions, where some may happen too quickly for characterization.

The cooling system controller generates, for each thermal function, a local INn, in a stable well calibrated way to perform extended characterization. The cooling system controller, for a given external environment condition, will force each INn value of the thermal function (otherwise some are external environment conditions) by pertinently changing the set-points on the other thermal components. For example, to calculate consumption of a given computer room air conditioning (CRAC) unit, it is necessary to change water pump set-points as well as the free cooling set-points to permit testing of different consumption of the CRAC for different set-points each for different water flow, pressure and temperature conditions.

In order to extend the characteristics to different heat conditions, set-points of other CRACs in the computer data center will be forced or constrained. The global heat extract from the computer data center may be changed by calibrating individual CRAC for different external conditions. Adjusting set-points in other CRACS will permit these CRACS to absorb more or less heat, thereby impacting the remaining heat to be handled by the CRAC under characterization.

The embodiments offer a high level of performance that is humanly unachievable.

The embodiments offer an independent solution that does not require a high administration overhead.

The embodiments offer a high speed of control.

The embodiment provide a flexible management system that is open to installation updates and reuse of cooling tools.

The embodiments tightly bind network concepts, operational research algorithms and statistical analysis tools in order to characterize and analyze a thermal system comprising a network of thermal components; each thermal component having a minimum set of parameters including specific environmental parameters based on factual static and transition performance. Global static and transition energy consumption for the thermal system is minimized using further operational research algorithms. The installation is extendable with new features using a continuous discovery and learning process.

The embodiments are independent of the cooling technology used and the continuous learning process permits adaption to any updates in cooling technology.

The embodiments address the following in situ characterization.

The relevant characteristic elements to be considered at detailed level as well as their level of precision, can so be learned and used to operate a coherent dataset for the cooling network. The characteristics are so effective at a detailed level never furnished by the vendor of a cooling subsystem, with effective values that are tested in the final environment and not in a laboratory.

A passive element, for example a piping system, is a major part of the cooling loop and optimization calculation. This kind of element is physically built to connect active cooling parts and its geometry is specific to the building arrangement and constraints. This kind of element is extremely specific to the final installation and represents a transfer function between active elements that can only be characterized in situ.

Finally, the embodiments take into account the performance difference that naturally exists for each cooling component after a given time; these differences are automatically detected, addressed to the data-center administrator who validates whether the deviation is abnormal and will correct it, or a natural deviation (slight degradation induced by oldness of an element) that is so considered in the characterization tables to adapt/update the global balancing of the network.

In a second aspect of the invention, there is provided a method for managing a cooling system for an installation of heat generating machines having variable cooling requirements, the cooling system comprising two or more thermal components sharing a first cooling fluid circuit and first cooling fluid for cooling the installation, the method comprising: recording the variable cooling requirements of the machines; measuring and recording outputs for each thermal component in response to a plurality of input control settings for generating a respective set of static set-points for each thermal component; measuring and recording changes in output over time for each thermal component in response to a plurality of input control setting changes; generating a logical model of the thermal components based on: relationships between the thermal components, operating fluid flow and around the thermal components, and set-points of each component; finding a minimum energy consumption for the cooling system; and continuously adjusting control settings for each component to match the minimum energy consumption.

The preferred embodiment is a cooling system controller and method that provides an efficient method of controlling thermal properties of a thermal system, for example a computer data center, independently of the technology and layout. The system applies a defined architecture, and is essentially adaptable to any architecture update, and consequently is the best method to discern the best investment to place when global cooling performance needs to be improved.

The cooling system controller and method will permanently optimize the efficiency on the cooling capacity range of a given installation, in static states and during transitions, based on an improved characterization of all thermal components in a thermal system.

The cooling system controller and method is for discovering characteristics indexed by specific environment parameters that are not possible to understand from a component datasheet or by isolated experimentation. The cooling system controller and method enables standard alarm detection and preventive warnings based on possible deviation from their specific static and dynamic qualified and validated behaviour.

Preferably, the logical model is adjusted to accommodate the dependencies of each of the thermal components as the behaviour of other thermal components changes over time.

More preferably, the cooling system comprises one or more cooling subsystems, whereby a cooling subsystem comprises one or more cooling components.

Even more preferably, at least one of the plurality of cooling subsystems comprises a second cooling fluid circuit and a second operating fluid different from the first operating fluid of the cooling system, and wherein generating the logical model incorporates adjustments respecting characteristics of the second operating fluid different from the first operating fluid.

Most preferably, a component dynamic behavior comprises a response time.

Advantageously, for a given static regulation point when a new sampling deviates from the average and standard deviation, an alert is addressed to an administrator to validate if the warning is an acceptable increase of the statistical characterization envelope or a is true anomaly.

More advantageously, predictive warnings are generated when measurements move out of threshold envelopes whereby potential problems can be identified before installation crashes.

Most advantageously, the logical model considers energy reuse between thermal components.

In a third aspect of the invention, there is provided a method in a computer cooling installation system (with many cooling appliances) comprising: characterizing each cooling appliance in a static and a dynamic dimension indexed by their effective direct environment conditions; linking all cooling appliances as a logical network; extracting from a set of cooling parameters including inputs and outputs from the logical network and using parameters constraints to optimize the cooling parameter inputs for the lowest overall power consumption; and when the cooling parameters change, extracting a "transition route" from the optimized parameters to the new parameters.

Thereby the embodiments optimize and minimize global static and transition consumption by synchronizing the following approaches: artificial intelligence; operational research; statistical treatments; and real-time execution routines based on a sharp learning/knowledge of the installation.

In a fourth aspect of the invention, there is provided a computer program product for a computer controlled cooling installation, the computer program product comprising a computer-readable storage medium having computer-readable program code embodied therewith and the computer-readable program code configured to perform the methods.

The computer program product comprises a series of computer-readable instructions either fixed on a tangible medium, such as a computer readable medium, for example, optical disk, magnetic disk, solid-state drive or transmittable to a computer system, using a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, preloaded with a computer system, for example, on a system ROM or fixed disk, or distributed from a server or electronic bulletin board over a network, for example, the Internet or World Wide Web.

In a fifth aspect of the invention, there is provided a computer program stored on a computer readable medium and loadable into the internal memory of a digital computer, comprising software code portions, when the program is run on a computer, for performing the method claims.

In a sixth aspect of the invention, there is provided a data carrier aspect of the preferred embodiment that comprises functional computer data structures to, when loaded into a computer system and operated upon thereby, enable the computer system to perform the method claims. A suitable data-carrier could be a solid-state memory, magnetic drive or optical disk. Channels for the transmission of data may likewise comprise storage media of all descriptions as well as signal-carrying media, such as wired or wireless signal-carrying media.

Referring now to FIG. 1, the deployment of a preferred embodiment in computer processing system 10 is described. Computer processing system 10 is operational with numerous other general purpose or special purpose computing system environments or configurations. Examples of well-known computing processing systems, environments, and/or configurations that may be suitable for use with computer processing system 10 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices.

Computer processing system 10 may be described in the general context of computer system-executable instructions, such as program modules, being executed by a computer processor. Generally, program modules may include routines, programs, objects, components, logic, and data structures that perform particular tasks or implement particular abstract data types. Computer processing system 10 may be embodied in distributed cloud computing environments where tasks are performed by remote processing devices that are linked through a communications network. In a distributed cloud computing environment, program modules may be located in both local and remote computer system storage media including memory storage devices.

Computer processing system 10 comprises: general-purpose computer server 12 and one or more input devices 14 and output devices 16 directly attached to the computer server 12. Computer processing system 10 is connected to a network 20. Computer processing system 10 communicates with a user 18 using input devices 14 and output devices 16. Input devices 14 include one or more of: a keyboard, a scanner, a mouse, trackball or another pointing device. Output devices 16 include one or more of a display or a printer. Computer processing system 10 communicates with network devices (not shown) over network 20. Network 20 can be a local area network (LAN), a wide area network (WAN), or the Internet.

Computer server 12 comprises: central processing unit (CPU) 22; network adapter 24; device adapter 26; bus 28 and memory 30.

CPU 22 loads machine instructions from memory 30 and performs machine operations in response to the instructions. Such machine operations include: increment or decrement a value in register (not shown); transfer a value from memory 30 to a register or vice versa; take instructions from a different location in memory if a condition is true or false (also known as a conditional branch instruction); and add or subtract the values in two different registers and put the result in another register. A typical CPU can perform many different machine operations. A set of machine instructions is called a machine code program, the machine instructions are written in a machine code language which is referred to as a low level language. A computer program written in a high level language needs to be compiled to a machine code program before it can be run. Alternatively, a machine code program such as a virtual machine or an interpreter can interpret a high level language in terms of machine operations.

Network adapter 24 is connected to bus 28 and network 20 for enabling communication between the computer server 12 and cooling network 200A or 200B (see FIG. 2).

Device adapter 26 is connected to bus 28 and input devices 14 and output devices 16 for enabling communication between computer server 12 and input devices 14 and output devices 16.

Bus 28 couples the main system components together, including coupling memory 30 to CPU 22. Bus 28 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Memory 30 includes computer system readable media in the form of volatile memory 32 and non-volatile or persistent memory 34. Examples of volatile memory 32 are random access memory (RAM) 36 and cache memory 38. Generally, volatile memory is used because it is faster and generally non-volatile memory is used because it will hold the data for longer. Computer processing system 10 may further include other removable and/or non-removable, volatile and/or non-volatile computer system storage media. By way of example only, persistent memory 34 can be provided for reading from and writing to a non-removable, non-volatile magnetic media (not shown and typically a magnetic hard disk or solid-state drive). Although not shown, further storage media may be provided including: an external port for removable, non-volatile solid-state memory; and an optical disk drive for reading from or writing to a removable, non-volatile optical disk such as a compact disk (CD), digital video disk (DVD) or Blu-ray. In such instances, each can be connected to bus 28 by one or more data media interfaces. As will be further depicted and described below, memory 30 may include at least one program product having a set (for example, at least one) of program modules that are configured to carry out the functions of embodiments of the invention.

The set of program modules configured to carry out the functions of the preferred embodiment comprises cooling module 300. Further program modules that support the preferred embodiment but are not shown include firmware, boot strap program, operating system, and support applications. Each of the operating system, support applications, other program modules, and program data or some combination thereof, may include an implementation of a networking environment.

Computer processing system 10 communicates with at least one network 20 (such as a local area network (LAN), a general wide area network (WAN), and/or a public network like the Internet) via network adapter 24. Network adapter 24 communicates with the other components of computer server 12 via bus 28. It should be understood that although not shown, other hardware and/or software components could be used in conjunction with computer processing system 10. Examples, include, but are not limited to: microcode, device drivers, redundant processing units, external disk drive arrays, redundant array of independent disks (RAID), tape drives, and data archival storage systems.

Cooling system 200A is a generic assembly of many thermal components (for example 40A, 40B and 40C) and thermal sub-systems of components (for example 42). Each component or sub-system drives a specific regulation based on locally implemented set-points and regulation modes; and all components and sub-systems are interconnected directly or indirectly to other cooling partners of the global chain. The piping elements interconnecting active cooling elements are so considered themselves as functions whose characteristic impact fluid characteristics (that is, pressure loss) and fluid distribution impacting so the global loop behavior.

It should be noted that pipe distribution functions are transfer functions that need to be characterized. Depending on the installation, the piping concerns water, air, gas or any other cooling fluid type of distribution.

The thermal system setup is defined to regulate cooling up to a predefined capacity limit. A more detailed example cooling system 200B is described with respect to FIG. 2A.

Figure 2A:
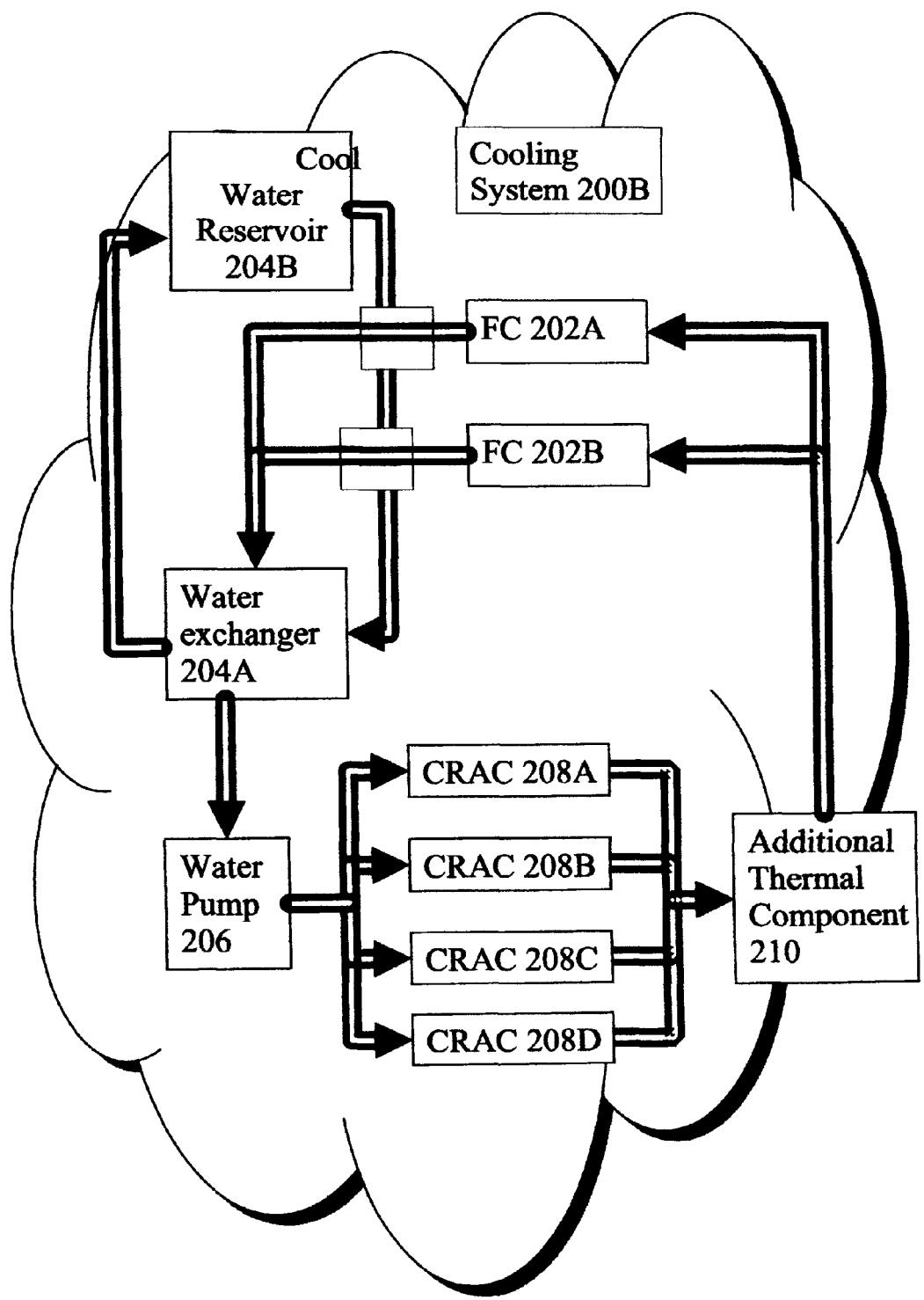
FIG. 2A is an example cooling system to be controlled by the preferred embodiment.

Referring to FIG. 2A, example cooling system 200B comprises: free cooling (FC) tool 202A and 202B; water exchanger 204A and cool water reservoir 204B; water pump 206; computer room air conditioning units (CRACs) 208A, 208B, 208C and 208D; and additional thermal component 210.

Free cooling tool 202A and 202B are individual thermal components connected in parallel to water exchanger 204A as part of a main circuit.

Water exchanger 204A is a part of a thermal subsystem that further comprises cool water reservoir 204B connected in an isolated secondary circuit to water exchanger 204A. Water exchanger 204A is further connected to water pump 206 in the main circuit.

Water pump 206 is a thermal component connected in parallel to CRACs 208A, 208B, 208C and 208D in the main circuit.

CRACs 208A, 208B, 208C and 208D are thermal components connected in parallel to additional thermal component 210 in the main circuit.

Additional thermal component 210 is a generic thermal component connected to FC 202A and 202B in the main circuit.

Each of these functions are set-point driven. Each interconnection is also considered a cooling function (a pipe interconnect function) but not described in detail here.

Figure 2B:
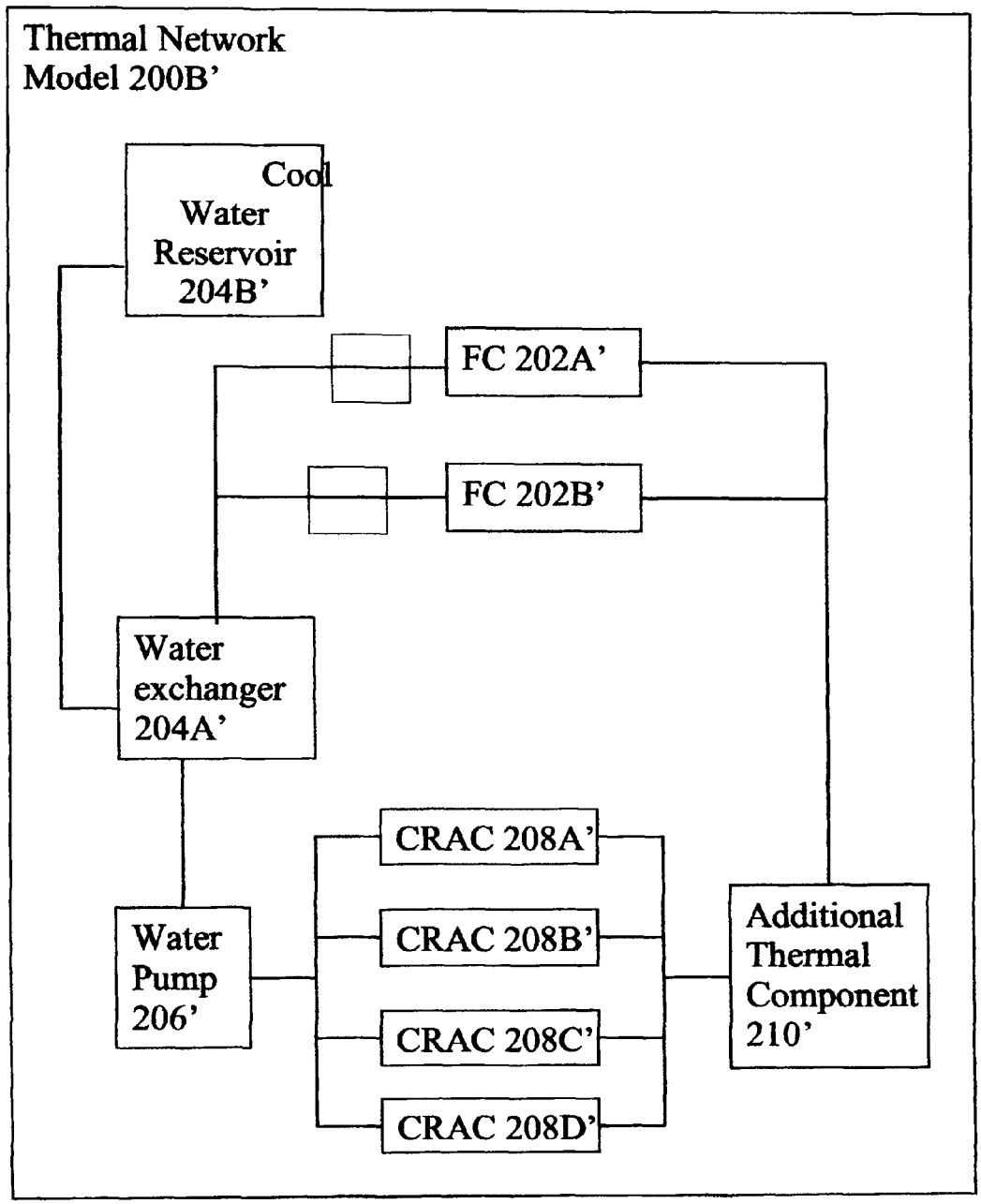
FIG. 2B is the associated thermal network model for the example cooling system of FIG. 2A.

Referring to FIG. 2B, an associated thermal network model 200B' for example cooling system 200B comprises: free cooling (FC) tool thermal functions 202A' and 202B'; water exchanger thermal function 204A' and cool water reservoir 204B'; water pump thermal function 206'; computer room air conditioning units (CRACs) thermal function 208A', 208B', 208C' and 208D'; and additional thermal function 210'.

A thermal network model of cooling components and cooling subsystems of the preferred embodiment is a representative of the physical cooling architecture. The physical cooling architecture of the preferred embodiment is made up of thermal functions representing thermal components or sub-systems of thermal components. Each thermal function is defined as having a specific function and a thermal component may have a chain or system of associated thermal functions. Thermal function characterization consists in a set-point of data corresponding to environmental conditions for defining a passive transfer function, plus its specific regulation set-points when the thermal function is an active part of the thermal network model. The example of FIGS. 1 and 2A comprises: thermal components and cooling subsystems all being connected to each other in a logical relationship. This logical relationship takes account that these components are connected in the same fluid circuits as shown in FIG. 1 and FIG. 2A.

Figure 3:
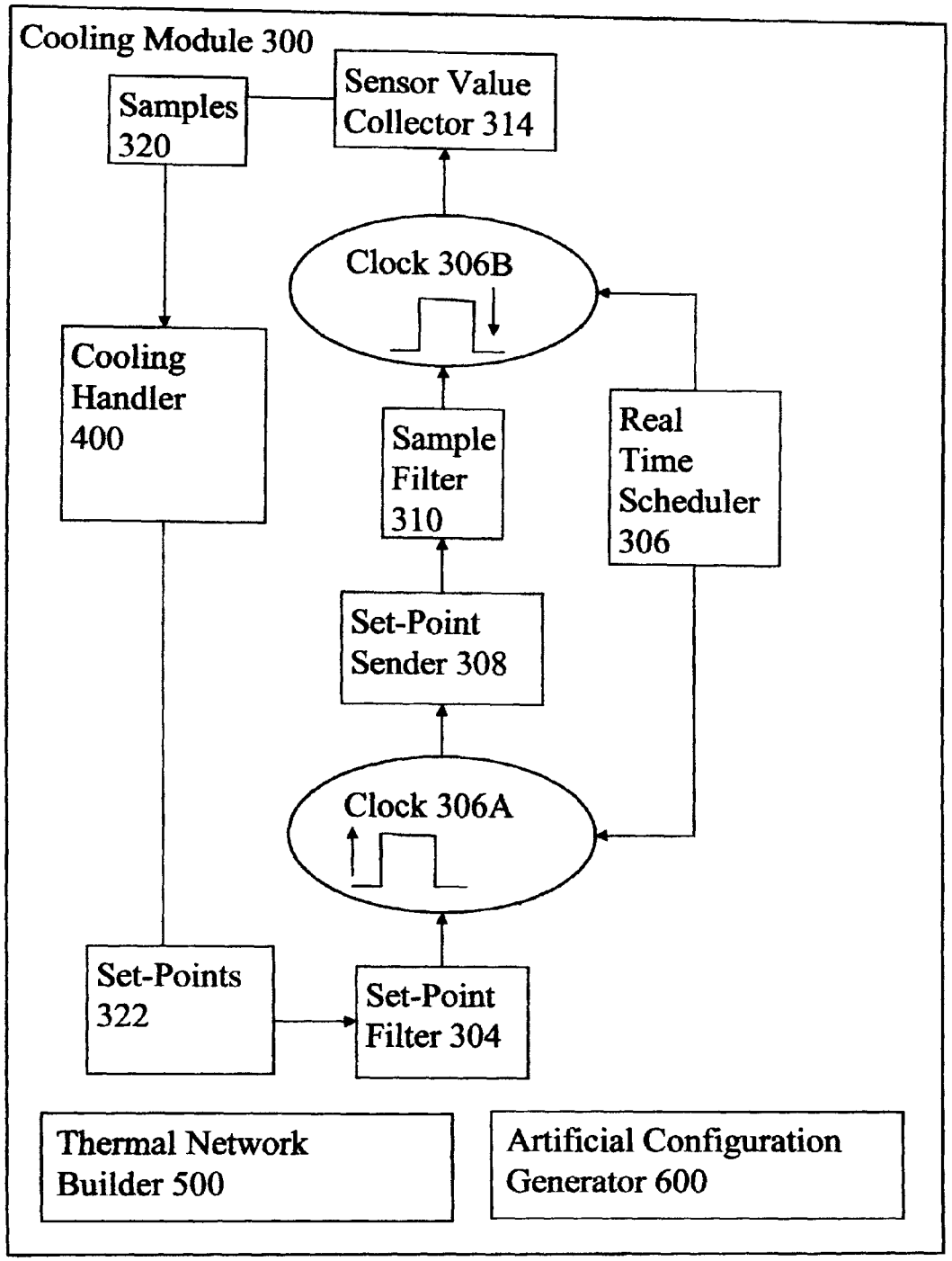
FIG. 3 is a component and workflow diagram of a cooling module of the preferred embodiment.

Referring to FIG. 3, cooling module 300 comprises: set-point filter 304; real-time scheduler 306; upstroke clock 306A and downstroke 306B; set-point sender 308; sample filter 310; sensor value collector 314; sample 320; cooling handler 400; thermal network builder 500; and artificial configuration generator 600.

Set-point filter 304 is for filtering set-points 322 that are generated by cooling handler 400.

Real-time scheduler 306 is for generating a square wave timing signal in real time, the square wave having an up part and a down part.

Upstroke clock 306A is for receiving the timing signal from real-time scheduler 306 and generating an upstroke timing signal on the upstroke of the real time signal.

Set-point sender 308 is for sending a group of set-points to cooling system 200B periodically on receipt of the upstroke timing signal.

Sample filter 310 is for filtering samples from cooling system 200B.

Downstroke clock 306B is for receiving the timing signal from real-time scheduler 306 and generating a downstroke timing signal on the downstroke of the real time signal.

Sensor value collector 314 is for collecting samples from cooling system 200B periodically on receipt of the downstroke timing signal.

Samples 320 are input to cooling handler 400.

Cooling handler 400 is for updating characterization tables and using them to calculate an optimal set of set-points. It is described in more detail with respect to FIG. 4.

Thermal network builder 500 is for building a logical network of thermal functions for modeling cooling system 200B and is described in more detail below with respect to FIG. 5.

Artificial configuration generator 600 is an engine whose role is to take initiatives to extend a characterization envelope of each thermal component. As earlier described, a change in fluid characteristics at one point in the loop will impact other points in the cooling loop or impact the operating conditions of thermal component. With a network of thermal functions in place, changing fluid characteristics at one point in the network is an opportunity to record new thermal function characteristics. A thermal function is considered as fully characterized and will no longer continue in the characterization process when all capable working conditions are covered.

Each time a sample for a given function is recorded in a characterization table, a statistical calculation attached to this record is updated. An average value and deviation are updated.

An administrator will check that the minimum records for a same line necessary to consider the characteristic line are valid and usable for operational research calculation. As long as the quantity of records is not attained, the artificial condition generator will continue to work to obtain the necessary quantity of records for a same line. This opportunity in the artificial condition generator priority chain will be placed lower than the opportunity for non-controllable environment characteristics.

It should be noted that beyond this fundamental initiative priority rule, multiple secondary priorities can be defined, depending on the installation type, and these are not developed here.

It should be further noted that even if the minimum of records accepted to consider the line as valid is attained, then each time samples issued from the network settings brings to the same line, the statistical record is updated and used to detect potential degradation of performance.

It should be even further noted that when the artificial conditions generator is characterizing a target device, by changing set-points on other components to extend its characterization envelope, not only will the target device under characterization be updated, but the other components will change their working conditions. This is due in part to the cooling function being a looped system. Other components will change their working conditions if they are part of the global looped function.

So each new characterization initiative will bring, for at least the targeted devices, new records and extend the envelope, but in the meantime permit to update all the other component characteristics. Some of them may in the meantime extend their own characterization envelope and some others that already are in working condition that were already characterized, will update at least their statistics and is an opportunity for deviation survey.

Based on this principle, it is understood that engineers, depending on the effective installation, can develop different strategies where the speed of extension of the knowledge envelopes can be prioritized.

Capable working conditions are based on defined usage limits.

A characteristic is considered stable and valid when the quantity of records for the characteristic result has reached a defined maximum value. Such a defined maximum value is set by an administrator with respect to the particular characteristic.

These limits being implemented will stop after a given time based on opportunity condition, the artificial condition generator for each sub-unit.

When one thermal function is fully characterized, it can be implemented in a partial operational research calculation when other independent thermal functions are not fully characterized. When all thermal functions are characterized, no more characterization opportunities exist and all the cooling is driven by sending set-points issued form the global operational process.

The role of a final operational research calculation is to balance effective sub-unit working conditions to minimize total cooling consumption.

For initial conditions, artificial condition generator 600 defines default set-point values 422 (see FIG. 4) to allow a maximum power extraction from the computer data center.

Furthermore, artificial condition generator 600 allows set-points to change as working conditions on each thermal function change and as non-controlled environment conditions change (for example, IT power or external air conditions).

So for each non-controlled condition, one record exists for thermal function. Running operational research calculations will not permit different thermal function contributions to balance, but will permit calculation of the total cooling consumption for the default set-points.

Artificial condition generator 600 creates artificial conditions for each thermal function for the purposes of extending a thermal function characterization envelope.

Furthermore, for non-controllable cooling environmental conditions, artificial condition generator 600 creates, for each thermal function, a maximum possible number of different local working condition to generate a wide range of resulting characteristics for sampling.

Artificial condition generator 600 will, for each level of non-directly controllable cooling condition, create artificial working conditions, thermal function after thermal function. Depending at what time these non-controllable cooling conditions occur, conditions for the same thermal function may not be completed because of the natural inertia of the cooling system to stabilize an impact of a set-point change. So each time the same non-controllable conditions occur, then it is probable that the thermal network is fully characterized and whereby the already known working conditions are not repeated.

Within a computer data center, the heat energy from extraction is the main non-controllable cooling condition. To characterize thermal functions, the server heat can be redirected partially or totally to the one thermal function under characterization by forcing the set-point of other thermal functions. Such operation means that maximum power throughout the computer data center is not necessary to characterize a thermal component and/or surrounding thermal components up to their maximum working capability.

Therefore, the speed of extending the characterization envelope depends on: the set-point function availability and the corresponding loop impact; and the response time in the global cooling loop. Moreover, the same approach can be implemented with different implementation variants.

Figure 4:
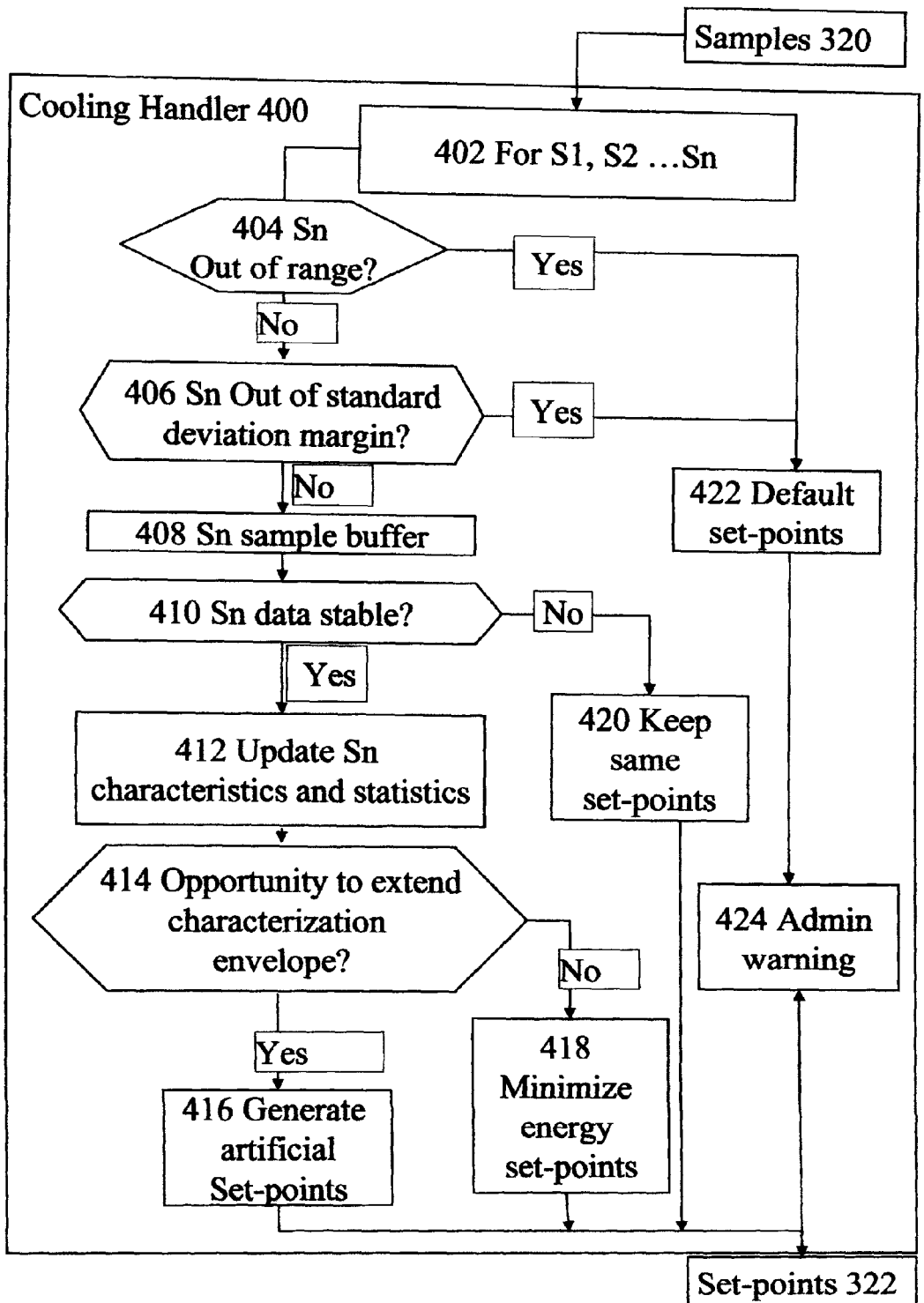
FIG. 4 is a flow diagram of the method of the cooling handler of preferred embodiment.

Referring to FIG. 4, cooling handler method 400 comprises logical process steps 402 to 424.

Step 402 is for defining a process loop for each sample taken from a sampled thermal component (S1, S2 . . . Sn) of the input samples 320, a sample from a generic sample unit is referenced as Sn. All samples can be processed in parallel but in the preferred embodiment they are dealt with in series.

Step 404 is for determining if the sample Sn is out of range and sending to step 422 if so. If within range, then the process continues at step 406.

Step 406 is for determining if the sample Sn is out of the standard deviation margin and sending to step 422 and step 424 if so. If within range, then the process continues at step 408.

Step 408 is for buffering the within range samples.

Step 410 is for determining if the sample is otherwise stable and the process continues at step 412 if so. Otherwise, then the process continues at step 420.

Step 412 is for updating the sample characteristics and statistics.

Step 414 is for determining if there is an opportunity to extend the characterization envelope and step 416 if so. If not, then the process continues at step 418.

Step 416 is for generating an artificial set of set-points in order to extend the characterization envelope of the sampled unit. Step 416 is performed by artificial conditions generator 600.

Step 418 is for generating a new set-points using operational research algorithms on the received sample and existing network model to minimize energy consumption of the thermal system. The cooling handling method ends for this particular sampling unit when a new sample is received.

Step 420 is for recycling the previous set-points when sample data is determined as unstable. The cooling handling method ends for this particular sampling unit when a new sample is received.

Step 422 is for recycling default set-points when samples are out of range or out of the standard deviation. The cooling handling method ends for this particular sampling unit until a new sample is received.

Step 424 is for sending a warning to a system administrator that default set-points are being used and that minimum energy consumption may not be achieved.

Figure 5:
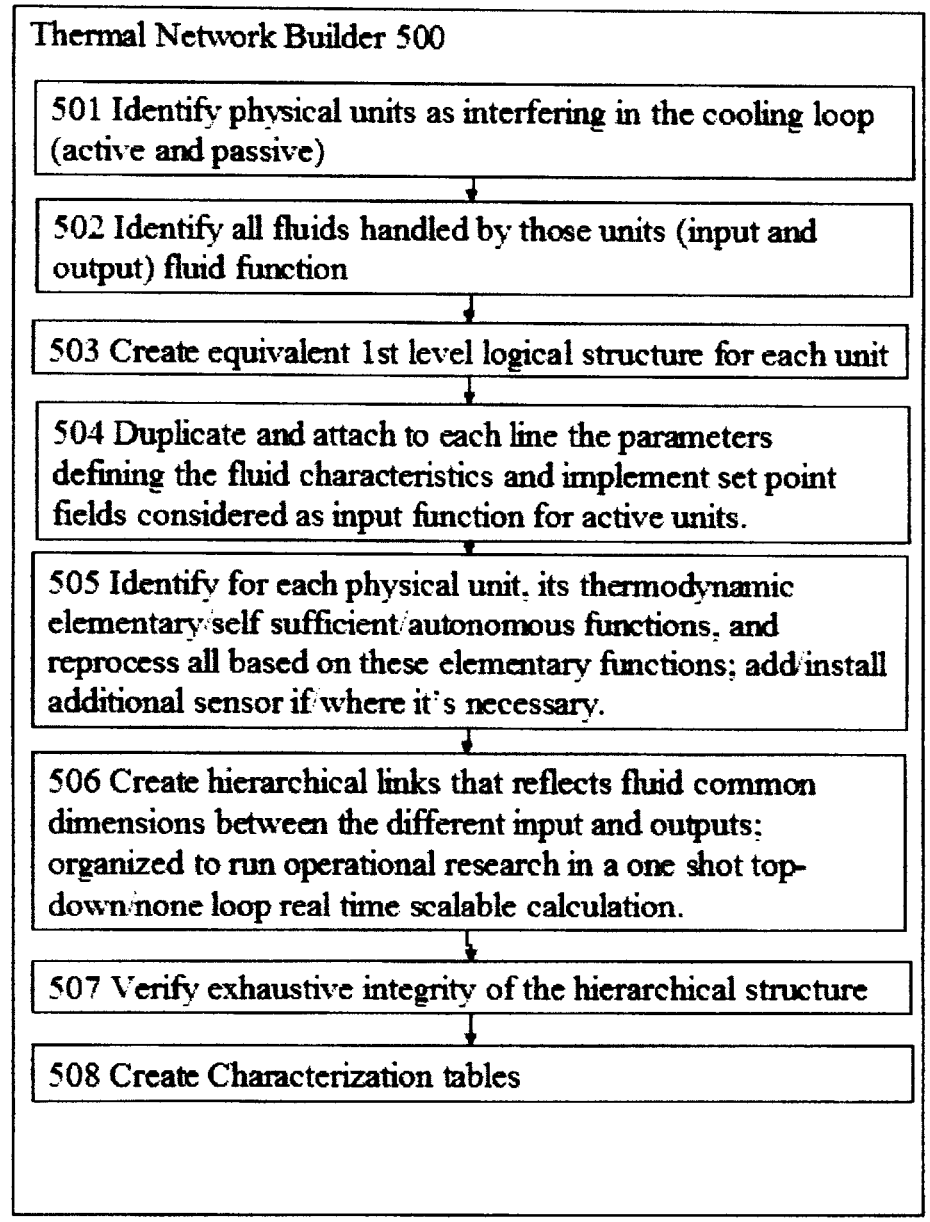
FIG. 5 is a flow diagram of logical network building method of the preferred embodiment.

Referring to FIG. 5, thermal network builder 500 comprises logical process steps 501 to 508. The objective of thermal network builder 500 is to establish a logical thermal network of thermal functions for use in calculating in a real time scalable way the optimal set-points to send to the thermal components. A logical thermal network comprises a logical description of the cooling system in elementary functions called thermal functions (sometimes referred to as sub-units). A thermal function is a coherent and self-sufficient function that gives the same output for a given input.

Each function is independently characterizable. The correspondence between each thermal function input and output is then logically established to describe exhaustively the cooling loop dependencies. This looped system must be coherent and exhaustive. Thermal functions and thermal components are defined as active and passive. Active functions and components are set-point driven (for example, CRACs, PUMPs, water heat exchangers). Passive functions and components do not use set-points but are functions impacting the fluid loop (for example, pipes). A hierarchic database is built where optimal set-points are extracted using a non-looped and top down process. For example, Select (all set-points)
From all thermal function tables
Where (all thermal function output=corresponding thermal function input)
Where (Sum of Power consumed is Minimum).
Each thermal function has a table. The relationship between those thermal functions are defined by the hierarchical implementation of those thermal function tables within a database.

Step 501 is for identifying physical thermal components as interfering in the cooling loop (active and passive).

Step 502 is for identifying all fluids handled by those thermal components (input and output) fluid function.

Step 503 is for creating equivalent first level logical structure (a thermal function) for each unit.

Step 504 is for duplicating and attaching to each line the parameters defining the fluid characteristics and implementing set-point fields considered as inputs for thermal functions. For example pressure, temperature and flow. Note that at this point, necessarily two types of thermal functions are to be considered because impacting the whole loop: passive functions as pipes that impact fluid flow and pressure distribution, and active functions that additionally react to set-points.

Step 505 is for identifying for each physical thermal component unit, its fundamental thermodynamic functions and in particular those functions that enable self-sufficiency and autonomy. Step 505 is for reprocessing samples based on these elementary functions and enabling additional sensors where necessary. If no additional sensor can be enabled, then it will record that an additional sensor needs to be installed. In general, this happens for active devices where multiple set-points for a same physical device drive have separate cooling impacts. For instance, a CRAC can be represented by two thermal functions: one driven by a valve opening set-point that impacts water flow distribution, and one blowing unit that regulates air cooling.

Step 506 is for creating hierarchical links that reflect common fluid dimensions between the different input and outputs, organized to run operational research in a one-shot top-down real-time scalable calculation. For instance, a hierarchical link structure is created to limit to avoid fluid dimension unnecessary records thereby limiting calculation time. For example, a pipe that has an impact on water flow and pressure distribution but not impact water inlet or outlet temperature can be modelled as Pipe1_WaterOutlet1_Flow=CRAC1_WaterInlet_Flow The simplification can result in the following hierarchical link:

CRAC1_WaterInlet_temp=
WaterToWaterExchanger_WaterOutlet_temp

Step 507 is for verifying exhaustive integrity of the hierarchical structure. An additional stand-alone sensor is enabled if and when necessary. 'Virtual transfer functions' are created where necessary to complete. For instance, as seen, a CRAC can be represented by at least two functions: air blowing>set-point controlled, and water flow set-point controlled. Depending on the functionalities of those set-points, a third thermal function may be created. If the water regulation unit set-point regulates the radiator temperature, then one of the output function of water regulation is this temperature and is a direct input to the blowing function. If the resulting water regulation set-point drives only the water flow, then a third thermal function needs to be created to represent a virtual transfer function between water and air, depending on their respective flow and temperature.

Step 508 is for creating characterization tables for each thermal function. Each table record will contain all input and output fluid characteristics as earlier defined and recorded during a sampling. Each of these records is associated via the hierarchical link with other thermal functions. The set-points are used for sampling of the resulting total consumed power, average power consumption, standard deviation and quantity of identical condition results. System administration defines a percentage for an acceptable standard deviation used for the learning process.

Figure 6:
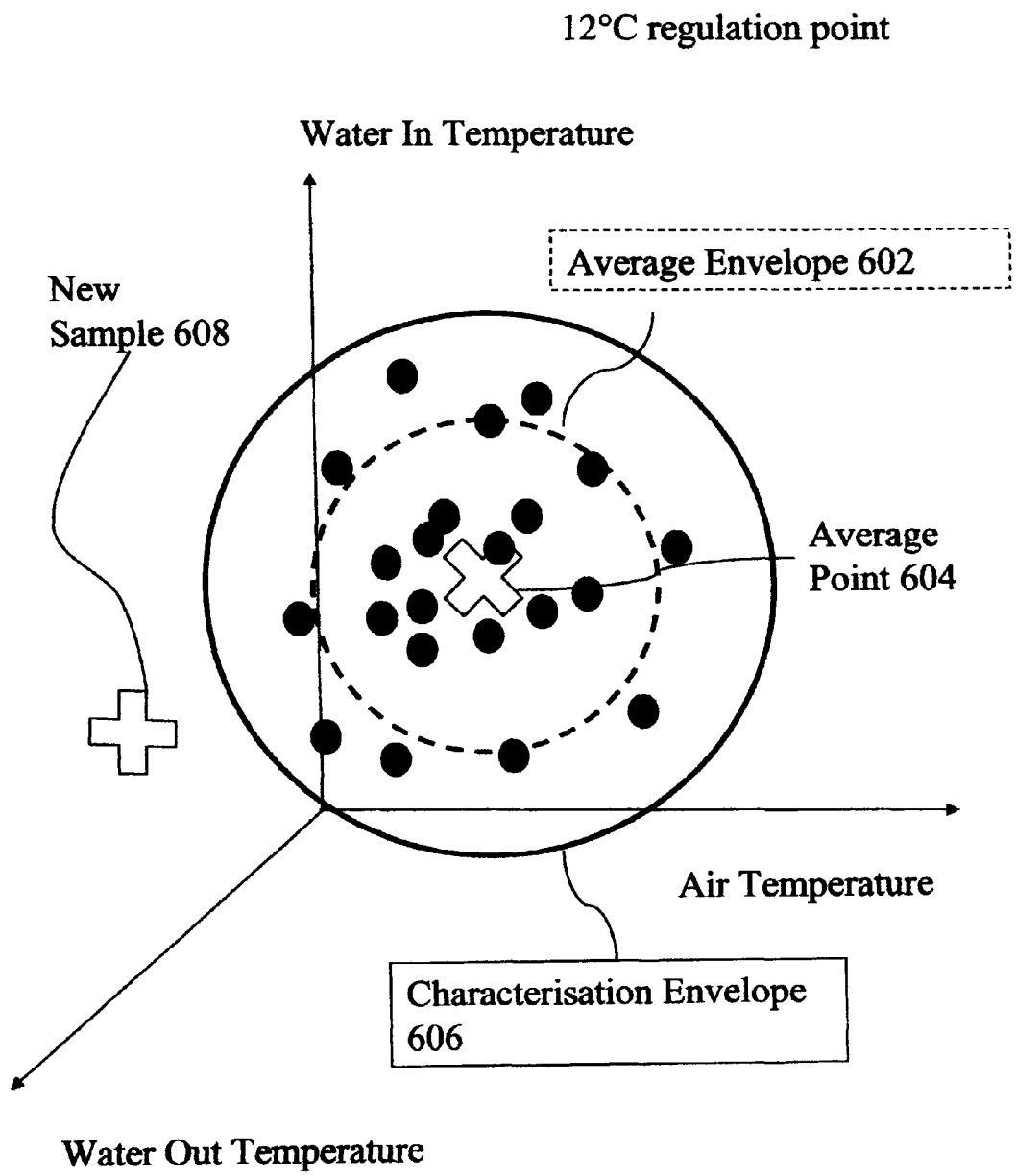
FIG. 6 is a an example set of characterization samples for a cooling component of the preferred embodiment.

Referring to FIG. 6, there is shown a two dimensional representation of three dimensional sampling performed on a thermal function. A static characterization for a given regulation set-point. The sampling chart is for one given regulation set-point. The axes show different input and output measurement values that characterize different environment variables of the block.

The drawing is a two dimensional representation of three dimensional data; the above example uses six dimensions; two or more dimensions can be used if variables are available and measured.

For example, consider the case of an air cooling tower thermal function that is refreshed with fans and water coming from an intramural computer room air conditioning system. A regulation value as set up is 12° C. The intended purpose is to control the number of fans to cool a water inlet down to 12° C. For each set-point, six measurements can be made: 1) water inlet velocity; 2) pressure; 3) temperature; 4) water outlet temp; 5) energy consumed to drive fans; and 6) external air temp. Still referring to FIG. 6, the three sampled dimensions for the same 12° C. regulation point are: water in temperature, water out temperature, and air temperature. A statistical treatment will calculate average ($\tilde{A}$) and standard deviation values that define average envelope 602 of the static environment. A white diagonal cross marks the average point 604. Multiple indexations can so be performed in the same principle to cover by learning the most possible regulation points and environment values. A characterization envelope 606 is equivalent to average $+/-n*\tilde{A}$. Here n is >1 and defines, after a first set of characterization, an automatic trigger level. As long as measured results stay within characterisation envelope 606, the block is considered as working in good conditions.

When a new sample is outside characterization envelope 606 (for example new sample 608), a warning (for example, an email) is addressed to an administrator. After investigation, two choices are available. A) The analysis reveals no dysfunction, so that a cooling method administrator can accept this new sampling, and the characterization envelope 606 can be extended or improved. B) In the other case, this warning is an alert that requests intervention. All these protocols run permanently to increase the knowledge base.

For a given set-point, certain questions can be answered. For example, how quickly can hot water be cooled in the aero-cooler? Another example is answered by changing a set-point in a calibrated manner to determine the extra energy consumed to change the speed of the acceleration dependent air fans. This other set of data permits calculation of the optimum roadmap to follow when the cooling method walks from one set of set-points to another.

Specific cases of energy reuse equipment, that is a thermal component that reuses energy from another thermal component, are considered in the thermal network. In this case, typically an apparatus connected to the intramural installation will use extra energy in another building; that is hot water derived in heat exchangers in another building. The cooling method will handle that as a traditional aero cooling system as finally this special heat exchanger returns water (in our example) with less heat. In that particular case, the cooling model is extended to include other building and acts as described before. If the cooling model cannot be extended to this next building, some non-reachable characteristics of the energy reuse tool can define manually to permit anyway a global cooling performance. That is, a parameter table that describes dependencies between cooling controller measurable values and those specific to the other buildings. A cooling controller is sometimes referred to as artificial controller intelligence (ACI). Learning will exist but only for the accessible sensors of the reuse tool.

Calculating Target Set of Set-points.

Each thermal function has so been structured with direct or indirect dependencies with other blocks of the cooling chain, or with independent, external measurable influencers. An example air cooling tower can be characterized with one or more of the following set-points: 1) external air temperature considered as a measurable independent influencer; 2) water inlet characteristics that are directly linkable to another block of the chain. The intramural water pipe/pump outlet is considered as another block where this data is used to characterize its specific function; and 3) water outlet is a parameter of the aero cooler that is linked because it belongs directly to the water inlet of the intramural CRAC passive distribution pipe block. So any block is linked directly or indirectly to any other one of the chain.

To calculate the optimal static target set of set-points, the cooling method links all thermal function parameters together and simultaneously reads external influencers (that is external air temperature, and intramural heat generated by the servers) and, using operational research rules, defines, within the characterization envelope, the lowest power consuming static target set-points.

In our example, air cooling is set up at 12° C. This value is necessary for CRAC to bring 20° C. at server air inlet at nominal/max power. When servers are consuming only 10% of their nominal value, CRACs will only need 18° C. water inlet. There is no necessity to force blowers to bring water down to 12° C. with unnecessary extra power consumption.

The cooling method can increase the air regulation set-point from 12° C. to 18° C.

Without the preferred cooling method, the cooling would be performed but inefficiently.

The cooling method will optimize the whole thermal network, it will harmonize all dependencies, and optimize the best compromise between thermal components (for example, lowering air fans and/or lowering water pump of CRAC fans).

Calculating Thermal Function Envelopes

As the cooling method manages sub-element regulation points with their own regulation margin, and the cooling method calculation is very fast compared to cooling infrastructure inertia, the cooling method implicitly detects small steps compared to the regulation margin of the previous step.

So, when the cooling method detects a change and calculates a new target set of set-point to implement, the prior set-point will cover the new request, but un-optimized.

So, after having calculated a new regulation target, the cooling method will calculate, based on the transient characterization already performed, all possible roads to move to the new set-points.

Figure 7A:
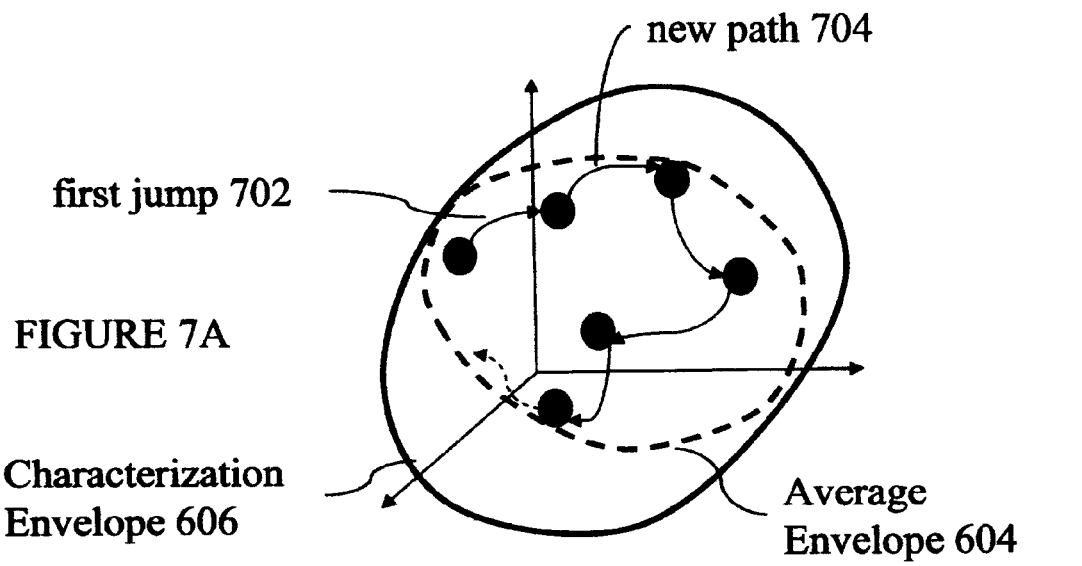
FIGS. 7A, 7B and 7C are graphs of set-point transitions for particular examples addressed by the embodiment.

Referring to FIG. 7A, the effective behavior of cooling method set-points are shown as real conditions. Each line shows a calculated jump. The arrows represent time flow. A first change of condition requests a first path 702 (first solid arrow). Considering cooling method speed compared to cooling inertia, the jump is short. So before the target is reached, new conditions occur; first path road 702 is interrupted and a new path 704 is started and so on within characterization envelope 606. This highlights that sharp optimizing target set-points are as important as optimizing continuous transition steps as cooling method can do with its specific learning rules.

Predictive Warnings

Figure 7B:
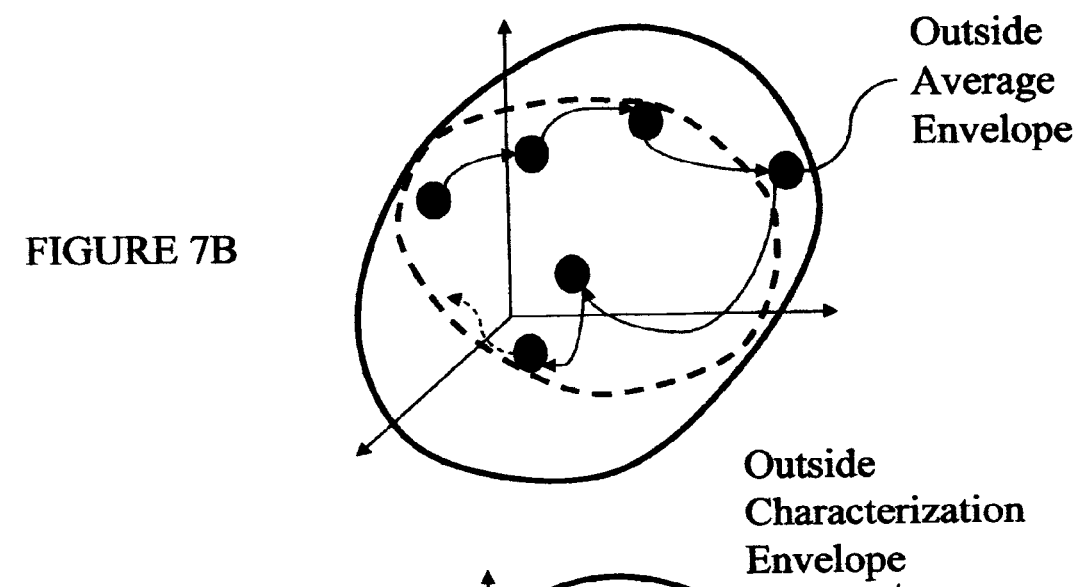

Referring to FIG. 7B, for a given static regulation point, when a new sampling deviates from the average and standard deviation, an alert is addressed to the cooling method administrator to validate if the warning is an acceptable increase of a statistical characterization envelope, or is a true alarm/anomaly. This is a sharp warning compared to standard detections because it takes into account the static behaviour of the component in its environment. When moving from one set of set-points to another, this first identification continues to work all along the transition. On top, predictive alarms can be handled the same way when transition characteristics or 'response times' are out from the transition learning authorized shape. Therefore, when a water pump is requested to increase its speed and the measured water velocity does not reach the requested speed in a timely manner, the detection can announce beginning of a problem like: "Pump mechanism is too old or rusted", or "something is blocking water transit in the pipes (dust in water, filters to change)".

When a target set of set-points is out of a characterization envelope, then a warning is sent to the cooling method administrator to validate if this is normal or not. Depending on the answer, whether no anomaly is identified, and cooling method extends its learning scope, or there is effectively an anomaly that requests intervention.

Figure 7C:
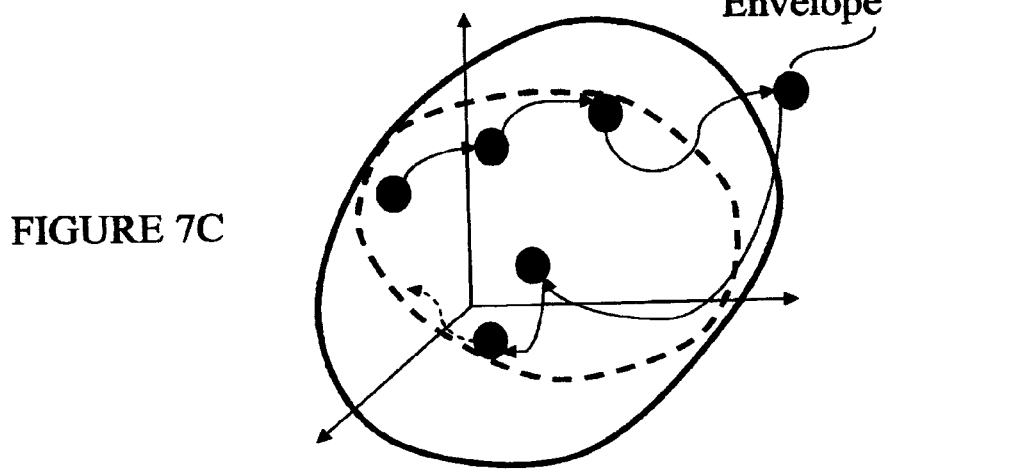

Referring to FIG. 7C, in the same way, when a new cooling request is outside the characterization envelope, an email alarm is sent to an administrator for immediate intervention.

Static Characterization Summary.

The cooling system controller of the embodiments is a solution that warranties the best optimization of a cooling installation whatever cooling elements are used. This preferred embodiment tightly binds network theory, operational research and statistical analysis to characterize each thermal component at its basic level within its specific environment and based factual performance.

Global consumption is minimized using additional operational research algorithms. The installation is essentially extendable with new features using an automated learning process that does not request particular human cooling competencies. On top of standard alarms, it can so generate predictive warnings that will announce potential problems before a crash. The cooling system embodiment comprises: 1) a standard computer server equipped with network modeling, operational research, database management, statistical management; and 2) real-time electronics to interface to the cooling system for calculated optimized real-time execution. No human experts can reach this performance because the thermal network learning is permanent and continuous as the cooling system operates.

Static Characterization and Dynamic Characterization

The preferred static characterization embodiment (also known as fundamental artificial cooling intelligence, or "FACI") uses cooling module 300 to characterize a cooling infrastructure as a network of active and passive thermal functions (also known as elementary looped functions) where any action on an active function impacts multiple of other passive functions and active functions. A network of functions is tuned by a cooling handler by a process of change, measurement and feedback driven by artificial configuration generator 600. An operational research engine balances the condition of use of all thermal functions to realize a global minimum electrical consumption. In a static embodiment, every time a non-controllable environment change occurs (for example, external air conditions, intramural heat), the operational research engine calculates target set-points for changing cooling functions so that those environment changes can be balanced.

However, these target set-points are based on characterization of thermal components at a single point in time. Those non-controllable conditions are real time captured, so those condition changes are constantly adapted with a best set of set-points. It is important to note here that all cooling elements have their own implemented automatisms. When non-controllable environment changes occur slowly compared to reaction time of the cooling components, the extra consumption induced by the set of set-points variation is negligible and offers true optimized consumption for any environment condition. Therefore, when non-controllable environment changes are quicker than the reaction time of the cooling components, and when the range of reaction times is large, then the more unreliable will be the first order thermal network model for minimizing the energy consumption.

For example, a computer centre power doubling is detected and results in a water pump being set to double flow, a free cooling unit being set to double fan speed, and a CRAC being set to double fan speed. If reaction times of those three components are respectively 100 s, 10 s and 1 s, then during the 100 s to stabilize the water pump, the free cooling unit and the CRAC are not optimized and will compensate with their standalone automatism for the new environmental request, creating a non-optimized transition. This is in part due to cooling module 300 operating much faster than any cooling component.

A dynamic characterization embodiment (also known as dynamic ACI or DACI) is used to model reaction times of the thermal components and to keep extra consumption induced by set-point changes at a minimal level. If no other environmental change occurs to the slowest cooling component, then the final set-points will be those calculated using static characterizations.

The more conditions that change faster than cooling component reaction times, the more the extra consumption induced by set-point jumps becomes important and non-negligible.

The role of dynamic characterization is to minimize extra consumption induced by a cooling set of set-point change. Dynamic characterization embodiments can be separate cooling supervisor tools for characterizing transition performance of the active and passive components.

Different components are characterized based on a fully different base: active components characterize consumption induced by a set-point change, for example, testing water pump consumption trend from 3 bar to 4 bar, from 2 bar to 4 bar, from 1 bar to 5 bar. For each of the set-points, the static consumption is known. However, over consumption is the effective consumption induced for each type of jump. This value is the consumption induced on top the value in static; for a given set-point change, the extra consumption is characterized at the speed of the sampler.

For example, at t=0, the PUMP set-point is stabilized at 2 bars. An artificial dynamic condition generator tests a direct jump to 4 bars. The sampling is performed each 0.1 seconds and the 4 bars are measured as stable after 10 seconds. This will bring a consolidated characterization table that shows the speed of set-point change, as well as extra consumption between different set-point changes at the speed of the sampling clock. Each of the concerned fluid trends is characterized during the change.

During the stabilization period, the transit time of fluid characteristic change is time stamped characterized. For example, pipe water outlet characteristic stabilization changes following an inlet change. Any change of water pressure or flow at the inlet takes a minimum of time to transit in the pipe, and during stabilization the outlet flow distribution at the outlet of a pipe having multiple outlet will vary in the time prior stabilization.

The combination of those transit time and extra power consumption are not the same for a given new set-point value, but depend also on the delta value applied considering the set-point value the different functions had prior to the new set-point.

A water point that had a stabilized 2 bar position that needs to walk to 4 bar will induce more energy to stabilize at 4 bars than if it was at 3 bars.

The same approach is valid when set-points are requesting less energy for the new target set-point.

The combination of those characterization values: extra consumption and fluid reaction time, when used on all loop functions, allows calculation of the global behaviour of the loop on a time stamped basis. For example, if a pump quickly increases its consumption, then a little time later, based on the fluid transition in the loop, the consumption will start to impact adjacent active thermal components.

So for a given state of the cooling loop, dynamic characterization embodiments will take into account the state of the different cooling functions at the next sampling clock, as well as the extra consumption induced for the total installation.

As each component has different reaction times, the operational research calculation will use those dynamic characterizations and balance the best set of set-points delta that will bring to a minimum extra consumption for the total installation. If non-controllable environmental constraints stay stable, then the absolute values of those set-points will converge to the targeted static set-points. During the transition of the response time, those delta set-points are recalculated. For instance, an environmental change requests a doubling of a set-point of the free cooler and a doubling of water pump set-point. If a free cooler needs 100 seconds and pump 10 seconds to stabilize, then dynamic characterization may overshoot whether or alternatively the water pump and free cooler set-points to achieve the least intermediate transition consumption. The best profile being calculated based on different delta of set-points tested on each of those components, the overshoot will be a shared overshoot of both type of set-points, each time recalculated, having by the way taken into account the fluid transition time between those elements, as well as the specific reaction of the other components of the loop.

It is worth noting that the majority of cooling components are themselves working with their specific controller, whose role is to optimize their reaction and response. A proportional-integral-derivative controller (PID controller) is a generic control loop feedback mechanism (controller) widely used in industrial control systems. A PID controller calculates an "error" value as the difference between a measured process variable and a desired set-point. The controller attempts to minimize the error by adjusting the process control inputs. In a dynamic characterization process, the PID controller is considered as one of the set-points considered on top for characterizing a response to set-point change. So dynamic characterization will so characterize active cooling functions over time not only for only a delta of traditional set-points, but will index it with their PID controller set-points when addressable.

In summary, dynamic characterization is like a macro PID controller function that optimizes a set of set-point transitions to harmonize reaction time of the different cooling components with the best minimal consumption. When non-controllable environment changes occur slowly compared to reaction time of the slowest cooling element, the different real-time set-points will converge to the static values as would to static characterization. When environment changes are very quick, then dynamic characterization will be able to accelerate standard reaction time by overshooting set-points, always having balanced the best articulation of overshoots to minimize intermediate transitions. As a dynamic characterization process relates to transition behavior of cooling components, it can so detect transition evolutions that are abnormal (using as for ACI static statistical treatments) and detect so deviations from normal dynamic behavior and address so to an administrator preventive warnings (for example, rust in the water fluid because water pump behavior to a set-point increase did deviate from the characterized fluid evolution).

Further embodiments of the invention are now described. It will be clear to one of ordinary skill in the art that all or part of the logical process steps of the preferred embodiment may be alternatively embodied in a logic apparatus, or a plurality of logic apparatus, comprising logic elements arranged to perform the logical process steps of the method and that such logic elements may comprise hardware components, firmware components or a combination thereof.

It will be equally clear to one of skill in the art that all or part of the logic components of the preferred embodiment may be alternatively embodied in logic apparatus comprising logic elements to perform the steps of the method, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In a further alternative embodiment, the present invention may be realized in the form of a computer implemented method of deploying a service comprising steps of deploying computer program code operable to, when deployed into a computer infrastructure and executed thereon, cause the computer system to perform all the steps of the method.

It will be appreciated that the method and components of the preferred embodiment may alternatively be embodied fully or partially in a parallel computing system comprising two or more processors for executing parallel software.

It will be clear to one skilled in the art that many improvements and modifications can be made to the foregoing exemplary embodiment without departing from the scope of the present invention.

The invention claimed is:

1. A cooling system controller for an installation of heat generating machines having variable cooling requirements, the cooling system comprising two or more thermal components sharing a first cooling fluid circuit and first cooling fluid for cooling the installation, the cooling system controller comprising:
   a requirement discovery engine for recording the variable cooling requirements of the heat generating machines;
   a characterizing engine for measuring and recording outputs for each thermal component and characterizing each thermal component in a static dimension and a dynamic dimension indexed by an effective direct environment condition each thermal component provides in response to a plurality of input control settings for generating a respective set of static set-points for each thermal component;
   a logical model generator for generating a logical model of the thermal components based on: relationships between the thermal components, operating fluid flow around the thermal components, and static set-points of each component;
   an optimizer for finding minimum energy consumption for the cooling system; and
   an interface for continuously adjusting control settings for each component to keep the cooling system operating at the minimum energy consumption.

2. The cooling system controller according to claim 1, further comprising an adjusted logical model for accommodating the dependencies of each of the thermal components as the behavior of other thermal components changes over time.

3. The cooling system controller according to claim 1, wherein the cooling system comprises one or more cooling subsystems, whereby a cooling subsystem comprises two or more cooling components.

4. The cooling system controller according to claim 1, wherein at least one of the plurality of cooling subsystems comprises a second cooling fluid circuit and a second operating fluid different from the first operating fluid of the cooling system, and wherein generating the logical model incorporates adjustments respecting characteristics of the second operating fluid different from the first operating fluid.

5. The cooling system controller according to claim 1, wherein a component dynamic behavior comprises a response time.

6. The cooling system controller according to claim 1, wherein for a given static regulation point, when a new sampling deviates from an average and standard deviation, an alert is addressed to an administrator to validate if the deviation is an acceptable increase of a statistical characterization envelope or is a true anomaly.

7. The cooling system controller according to claim 1, further comprising generating predictive warnings when measurements move out of threshold envelopes whereby potential problems can be identified before installation crashes.

8. The cooling system controller according to claim 1, wherein the logical model considers energy reuse between thermal components.

9. The cooling system according to claim 1, wherein the logical model of the thermal components is further based on reaction times of the thermal components.

10. The cooling system controller according to claim 9, further comprising an artificial configuration generator engine which extends a characterization envelope of each thermal component.

11. The cooling system controller according to claim 10, wherein the characterization envelope comprises a characterization table for each thermal function of each thermal component.

12. The cooling system controller according to claim 11, wherein each table record in the characterization table contains all input and output fluid characteristics defined and recorded during a sampling of each thermal component.

13. A computer program stored on a non-transitory computer readable medium and loadable into an internal memory of a digital computer, comprising software code portions, which when the program is run on a computer, perform:
  managing a cooling system for an installation of heat generating machines having variable cooling requirements, the cooling system comprising two or more thermal components sharing a first cooling fluid circuit and first cooling fluid for cooling the installation, further comprising:
  recording the variable cooling requirements of the heat generating machines;
  measuring and recording outputs for each thermal component in response to a plurality of input control settings for generating a respective set of set-points for each thermal component;
  measuring and recording changes in output over time for each thermal component in response to a plurality of input control setting changes;
  generating a predictive alarm by taking into account a static behavior of each thermal component which exceeds a response time for a requested change of the plurality of input control setting changes;
  indicating through the predictive alarm a particular component of the thermal component which exceeds the response time for a requested change of the plurality of input control setting changes;
  generating a logical model of the thermal components based on: relationships between the thermal components, operating fluid flow around the thermal components, and set-points of each component;
  finding a minimum energy consumption for the cooling system; and continuously adjusting control settings for each component to match the minimum energy consumption.

14. The computer program according to claim 13, wherein the predictive alarm indicates that the particular component of the thermal component requires replacement.

15. The computer program according to claim 14, wherein the predictive alarm is an email message.

16. The computer program according to claim 15, further comprising characterizing each thermal component in a static dimension and a dynamic dimension indexed by an effective direct environment condition each thermal component provides.

\* \* \* \* \*